United States Patent
Hosseini et al.

(10) Patent No.: US 9,379,050 B2
(45) Date of Patent: Jun. 28, 2016

(54) ELECTRONIC DEVICE

(71) Applicant: Infineon Technologies Austria AG, Villach (AT)

(72) Inventors: Khalil Hosseini, Weihmichl (DE); Frank Kahlmann, Neubiberg (DE); Joachim Mahler, Regensburg (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/781,405

(22) Filed: Feb. 28, 2013

(65) Prior Publication Data

US 2014/0239466 A1   Aug. 28, 2014

(51) Int. Cl.
*H01L 23/495*   (2006.01)

(52) U.S. Cl.
CPC .... *H01L 23/49575* (2013.01); *H01L 23/49562* (2013.01); *H01L 2924/0002* (2013.01)

(58) Field of Classification Search
CPC ............... H01L 23/49575; H01L 23/49541; H01L 23/495; H01L 23/52
USPC ............ 257/666, 678, 685, 686, 690, 692; 438/106, 121, 123, 124; 174/529
See application file for complete search history.

(56) References Cited

U.S. PATENT DOCUMENTS

| | | | | |
|---|---|---|---|---|
| 4,588,177 A * | 5/1986 | White | ............... | H05K 3/301 269/41 |
| 5,677,567 A * | 10/1997 | Ma et al. | ................. | 257/666 |
| 6,263,424 B1 * | 7/2001 | Tran et al. | ............... | 712/221 |
| 7,485,954 B2 * | 2/2009 | Havanur | ............... | 257/686 |
| 7,969,018 B2 * | 6/2011 | Otremba et al. | ........... | 257/777 |
| 2006/0261473 A1 * | 11/2006 | Connah | ............. | H01L 23/15 257/728 |
| 2007/0096270 A1 * | 5/2007 | Pavier | ..................... | 257/666 |
| 2007/0096274 A1 * | 5/2007 | Pavier et al. | ............ | 257/676 |
| 2010/0244211 A1 * | 9/2010 | Galera | ........... | H01L 23/4334 257/675 |
| 2012/0181674 A1 * | 7/2012 | Cho et al. | ............... | 257/666 |
| 2012/0228696 A1 * | 9/2012 | Carpenter et al. | ........ | 257/329 |
| 2013/0285260 A1 * | 10/2013 | Denison et al. | ........... | 257/777 |

* cited by examiner

*Primary Examiner* — Meiya Li
*Assistant Examiner* — Peter M Albrecht
(74) *Attorney, Agent, or Firm* — Slater Matsil, LLP

(57) ABSTRACT

An electronic device includes a first transistor device with first contact elements, a second transistor device with second contact elements, and an electrical connection member with a first main face and a second main face opposite to the first main face. The first transistor device is disposed on the first main face of the electrical connection member and the second transistor device is disposed on the second main face of the electrical connection member. One of the first contact elements is electrically connected with one of the second contact elements by a part of the electrical connection member.

10 Claims, 5 Drawing Sheets

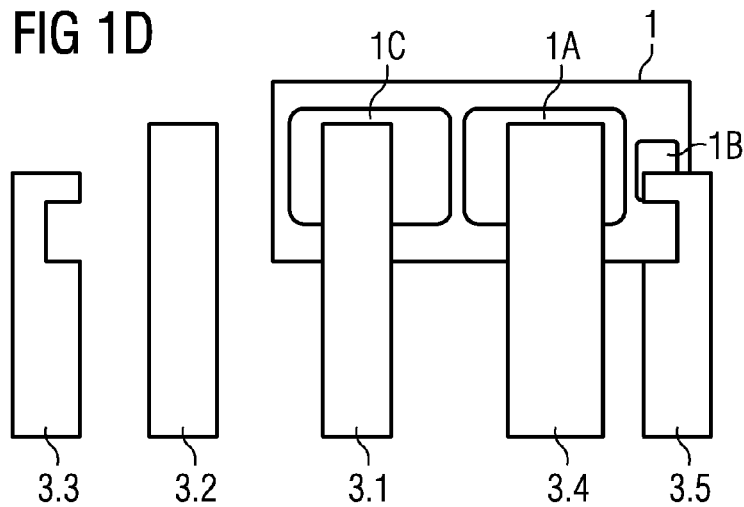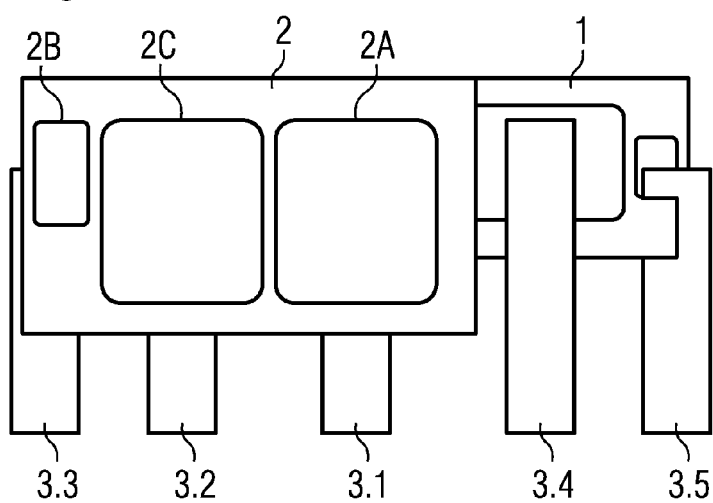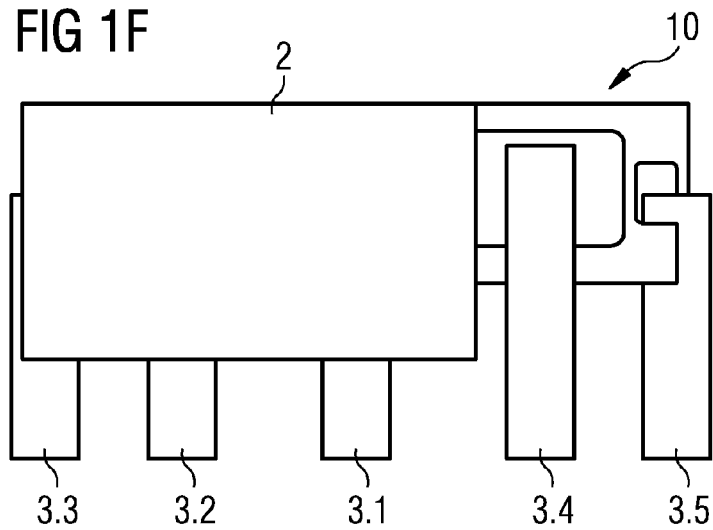

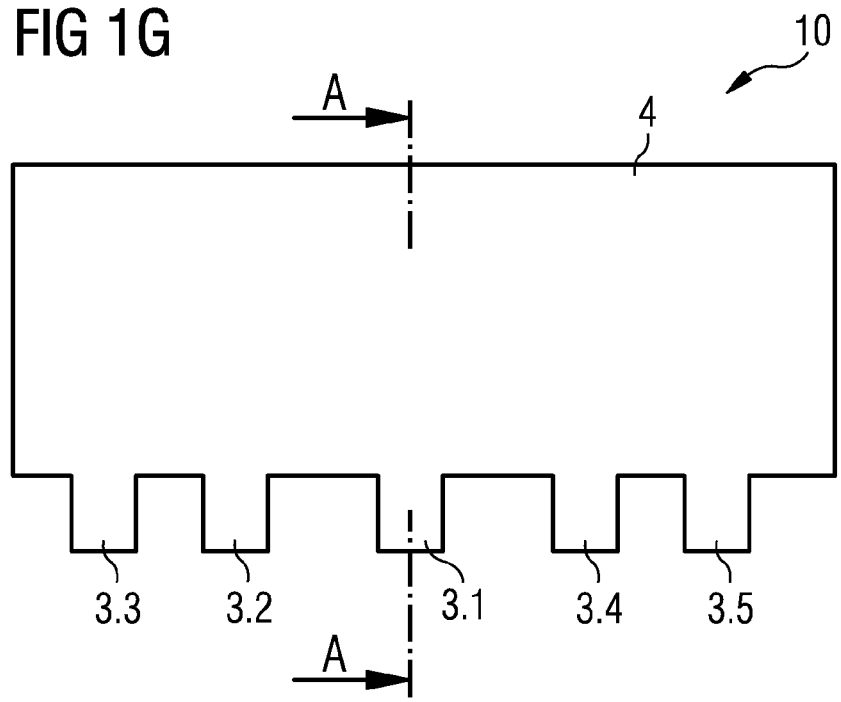
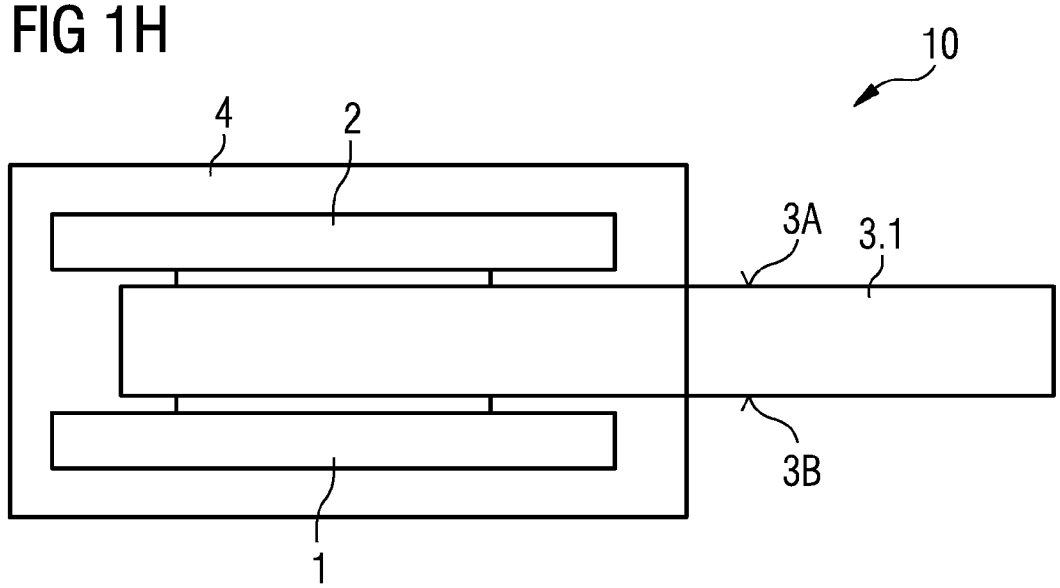

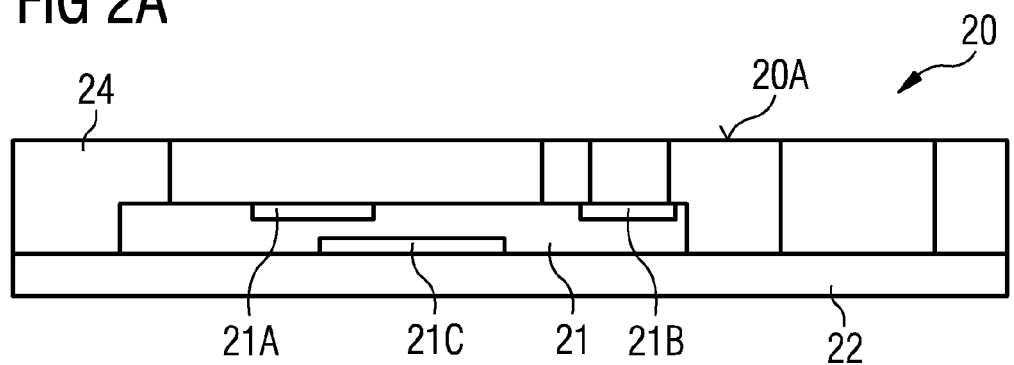
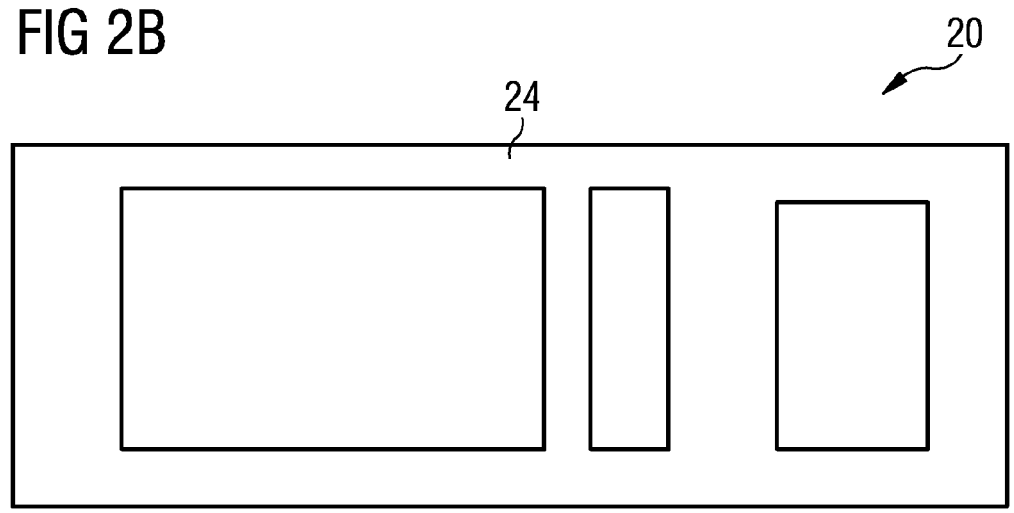
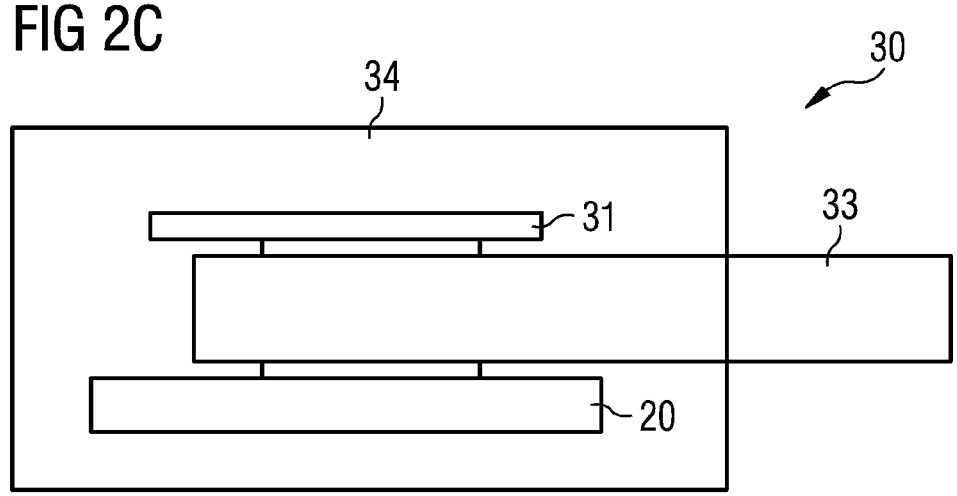

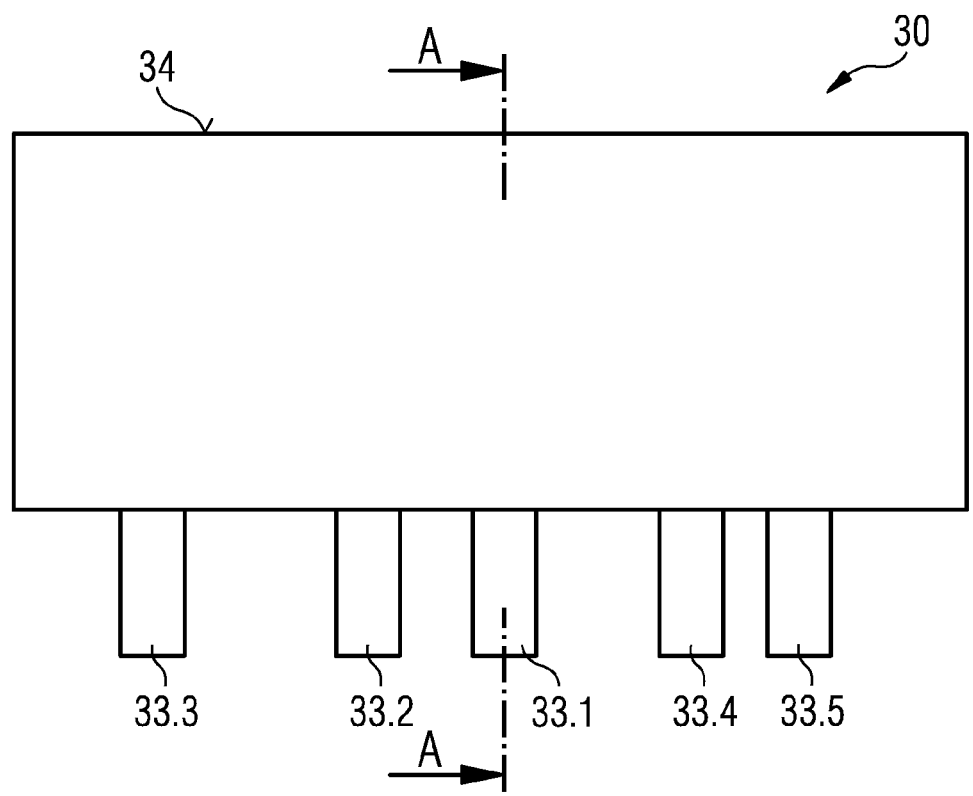
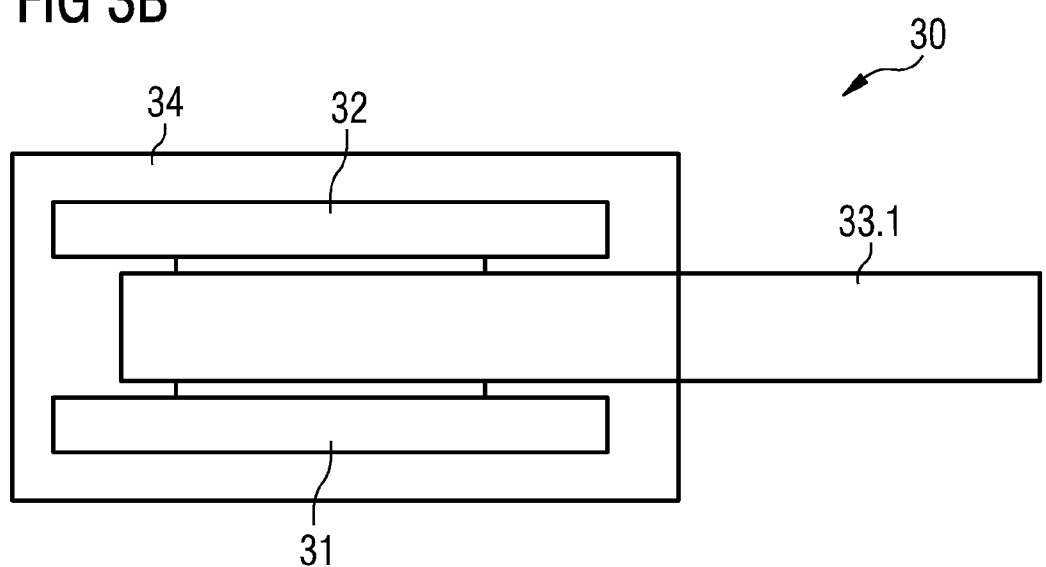

ELECTRONIC DEVICE

TECHNICAL FIELD

The present invention relates to an electronic device and to a half-bridge circuit.

BACKGROUND

In many electronic systems it is necessary to employ converters like DC/DC converters, AC/DC converters, or DC/AC converters in order to generate the currents and voltages to be used by the electronic circuit. A buck converter typically comprises one or more half-bridge circuits, each provided by two semiconductor power switches, such as power MOSFET devices, and further passive components, such as an inductance and a capacitance. The switching of the power MOSFET devices is controlled by a control semiconductor chip. The components of the buck converter may be provided as individual components which are mounted on a printed circuit board. Alternatively, a number of components may be accommodated in a single housing to provide a multi-chip module, also referred to as a System-in-Package (SiP), which has the advantage that the assembly of the module on the board is simplified and the space required on the board can be reduced. Moreover, there is an increasing demand to utilize other semiconductor materials than those employed in conventional devices in order to benefit from their electronic properties and improved switching characteristics.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 1A-1H show schematic representations for illustrating an example of an electronic device and the assembly thereof, wherein the electronic device comprises two semiconductor dies having their contact pads on one main face;

FIGS. 2A-2C show schematic representations for illustrating an example of an electronic device and the assembly thereof, wherein the electronic device comprises a first semiconductor die having contact pads on both main faces thereof and a second semiconductor die having contact pads on one main face thereof; and FIGS. 3A and 3B show schematic representations for illustrating an example of an electronic device comprising two transistor devices in the form of laminate packages.

DETAILED DESCRIPTION OF ILLUSTRATIVE EMBODIMENTS

Figure 1A:
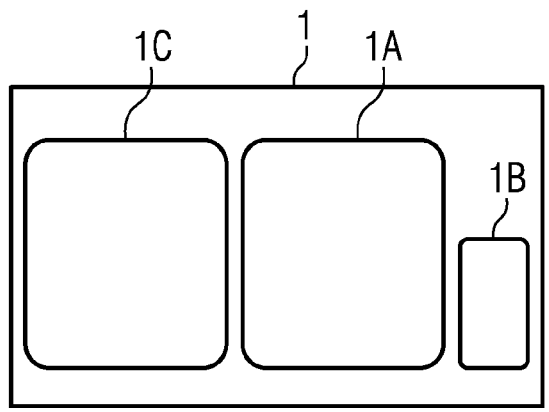
Figure 1B:
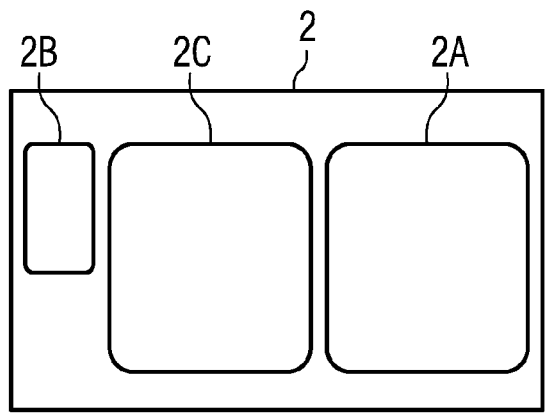
Figure 1C:
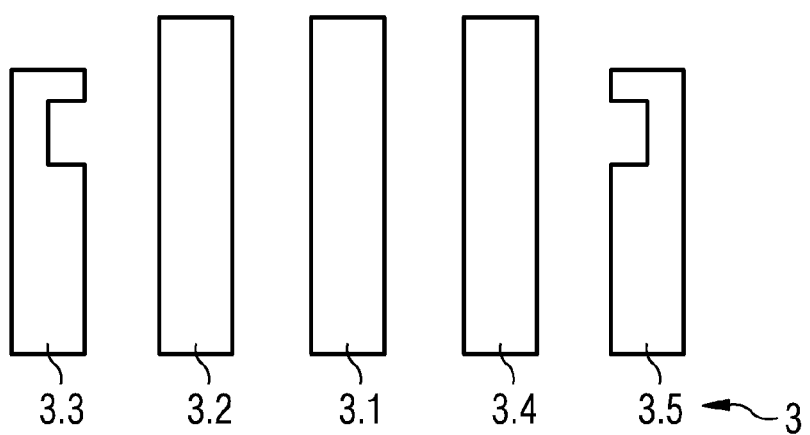

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include," "have," "with" or other variants thereof are used in either the detailed description or the claims, such terms are intended to be inclusive in a manner similar to the term "comprise." The terms "coupled" and "connected," along with derivatives may be used. It should be understood that these terms may be used to indicate that two elements cooperate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of an electronic device and of a half-bridge circuit may use various types of transistor devices. The embodiments may use transistor devices embodied in semiconductor dies or semiconductor chips wherein the semiconductor dies or semiconductor chips may be provided in a form of a block of semiconducting material as fabricated from a semiconductor wafer and diced out from the semiconductor wafer, or in another form in which further process steps have been carried out like, for example, applying an encapsulation layer to the semiconductor die or semiconductor chip. The embodiments may also use transistor devices comprising MOS transistor structures or IGBT (Insulated Gate Bipolar Transistor) structures, wherein those structures may be provided in a form in which the contact elements of the transistor device are provided on one of the main faces of the semiconductor die (horizontal transistor structures) or in a form in which at least one electrical contact element is arranged on a first main face of the semiconductor die and at least one other electrical contact element is arranged on a second main face opposite to the main face of the semiconductor die (vertical transistor structures).

In any case the semiconductor dies or semiconductor chips may comprise contact elements or contact pads on one or more of their outer surfaces wherein the contact elements serve for electrically contacting the semiconductor dies. The contact elements may have any desired form or shape. They can, for example, have the form of lands, i.e., flat contact layers on an outer surface of the semiconductor die. The contact elements or contact pads may be made from any electrically conducting material, e.g., from a metal as aluminum, gold, or copper, for example, or a metal alloy, or an electrically conducting organic material, or an electrically conducting semiconductor material. The contact elements may also be formed as layer stacks of one or more of the above-mentioned materials.

According to embodiments of an electronic device or the half-bridge circuit it is desirable to provide a package for embedding the semiconductor dies. According to an embodiment thereof the electronic device may conform to a single inline package (SIP) format. In addition or independent thereof the electronic device may comprise a package with outside leads arranged in such a way that the package resembles a TO (transistor outline) style package, such as a TO-220 package. According to embodiments of the electronic device or the half-bridge circuit, a plurality of leads as outside leads is provided, so that the electronic device can be mounted to a board like a printed circuit board (PCB).

The embodiments of an electronic device or the embodiments of a transistor device may comprise an encapsulant or encapsulating material having the semiconductor dies or transistor devices embedded therein. The encapsulating material can be any electrically insulating material like, for example, any kind of molding material, any kind of resin material, or any kind of epoxy material. The encapsulating material can also be a polymer material, a polyimide material, a thermoplast material, a silicone material, a ceramic material, and a glass material. The encapsulating material may also comprise any of the above-mentioned materials and further include filler materials embedded therein like, for example, thermally conductive increments. These filler increments can be made of AlO or $Al_2O_3$, AlN, BN, or SiN, for example.

FIGS. 1A-1H show an example of an electronic device and an assembly thereof. The electronic device 10, as shown for example in FIGS. 1A-1H, comprises a first transistor device 1 comprising first contact elements 1A, 1B and 1C, a second transistor device 2 comprising second contact elements 2A, 2B and 2C and an electrical connection member 3 comprising a first main face 3A and a second main face 3B opposite to the first main face 3A (see FIG. 1H). The first transistor device 1 is disposed on the first main face 3A of the electrical connection member 3 and the second transistor device is disposed on the second main face 3B of the electrical connection member 3 (see FIG. 1H). The contact element 1C of the first transistor device is electrically connected with the contact element 2A of the second transistor device 2 by a part 3.1 of the electrical connection member 3.

According to the embodiment of the electronic device 10 as shown in FIGS. 1A-1H, the first and second transistor devices 1 and 2 are both of the type of a horizontal transistor structure, i.e., the first and second contact elements 1A-C and 2A-C are disposed on one of the main faces of the transistor devices 1 and 2, respectively. In particular, as shown in FIGS. 1A-1H, the contact element 1A is the source contact element, the contact element 1B is the gate contact element, and the contact element 1C is the drain contact element of the first semiconductor device 1. In the same way the contact element 2A is the source contact element, the contact element 2B is the gate contact element, and the contact element 2C is the drain contact element of the second transistor device 2. FIG. 1H shows a cross-sectional side view representation of the electronic device 10 along line A-A of FIG. 1G.

According to an embodiment of the electronic device 10 of FIGS. 1A-1H, one or more of the first and second transistor devices 1 and 2 comprise or comprises a III-V semiconductor material, in particular a GaN based semiconductor material.

According to an embodiment of the electronic device 10 of FIGS. 1A-1H, the first and second transistor devices 1 and 2 comprise or comprises one or more of a power transistor, an MOS transistor, an insulated gate bipolar transistor, and a high electron mobility transistor (HEMT).

According to an embodiment of the electronic device 10 of FIGS. 1A-1H, the electrical connection member 3 comprises a plurality of lead elements 3.1, 3.2, 3.3, 3.4, and 3.5. The lead element 3.1 makes the electrical contact between the contact element 1C, in particular the drain contact element, of the first transistor device 1 and the contact element 2A, in particular the source contact element, of the second transistor device 2. The lead elements 3.1 to 3.5 may originate from a leadframe at the beginning of the fabrication process.

According to an embodiment of the electronic device 10 of FIGS. 1A-1H, the electrical connection member 3 comprises a direct bonded copper (DBC).

According to an embodiment of the electronic device 10 of FIGS. 1A-1H, the electronic device 10 further comprises an encapsulation layer 4 embedding the first and second transistor devices 1 and 2 in such a way that a part of the electrical connection member 3 is exposed to the outside. In particular, the encapsulation layer 4 forms a lamination package embedding the first and second transistor devices 1 and 2 and the individual leads 3.1 to 3.5 extend to the outside of the package as outside leads and can thus be used to mount the electronic device 10 to a board like a printed circuit board (PCB).

Assembling of the electronic device 10 will be performed as follows. As shown in FIG. 1D, the first transistor device 1 will be electrically connected to the electrical connection member 3 which means that the first contact elements 1A, 1B and 1C are connected with individual leads of the electrical connection member 3. In particular, the contact element 1C (drain contact element) is connected with lead element 3.1, the contact element 1A (source contact element) is connected with lead element 3.4, and the contact element 1B (gate contact element) is connected with lead element 3.5. Connecting the lead elements to the first contact elements can be done by, for example, soldering. As a result, the first transistor device 1 is connected to a first, lower main face of the lead element 3.1, 3.4 and 3.5 as can be seen in FIG. 1D.

Thereafter, the second transistor device 2 will be connected to the electrical connection member 3, namely to the lead elements 3.1, 3.2, and 3.3 on an upper main face thereof as shown in FIGS. 1E and 1F. FIG. 1E shows a top view representation of a situation before mounting the second transistor device 2, wherein the second transistor device 2 is shown such that the second contact elements 2A, 2B and 2C are facing the viewer only to show in which configuration the second transistor device 2 is intended to be mounted on the lead elements 3.1, 3.2 and 3.3. Thereafter, the second transistor device 2 is turned upside down so that the contact element 2A (source contact element) is attached to the lead element 3.1, the contact element 2B (gate contact element) is attached to the lead element 3.3, and the contact element 2C (drain contact element) is attached to the lead element 3.2. As a result, the first and second transistor devices 1 and 2 are placed one above the other with a lateral displacement between them. More important, the drain contact element 1C of the first transistor device 1 is electrically connected by the lead element 3.1 to the source contact element 2A of the second transistor device 2 so that, as a result, a series connection of the first and second transistor devices 1 and 2 is obtained.

Thereafter, the first and second transistor devices 1 and 2 and a part of the electrical connection member 3 are embedded in an encapsulation layer 4 as shown in FIGS. 1G and 1H. The encapsulation layer 4 can be made of any kind of mold compound as was already set out above. Those portions of the lead elements 3.1 to 3.5, which are not covered by the encapsulation layer 4, can be used for mounting the electronic device 10 to a printed circuit board in through-hole technology.

In the previous example of FIGS. 1A-1H the first and second transistor devices 1 and 2 are comprised of semiconductor dies like, for example, GaN dies, which have a horizontal transistor structure meaning that the contact elements of the dies are disposed on one of their main surfaces. In the following, another example will be shown in which other transistor structures are involved.

FIG. 2A shows a first transistor device 20 comprising a semiconductor die 21. The semiconductor die 21 comprises a vertical transistor structure which means that a source contact element 21A and a gate contact element 21B are disposed on an upper, first main face of the semiconductor die 21, and a drain contact element 21C is disposed on a lower, second main face of the semiconductor die 21. In order to fabricate a device in which the contact elements are disposed on one main surface, a rewiring can be performed in which the contact elements 21A-C have to be connected to external contact elements which are disposed in one common plane. For this purpose the semiconductor die 21 is attached to a carrier 22 with the drain contact element 21C facing the carrier 22. The carrier 22 can be, for example, a leadframe. Thereafter, an encapsulation layer 24 is deposited onto the semiconductor die 21 and the carrier 22 in such a way that the encapsulation layer 24 covers the upper main face and the side faces of the semiconductor die 21. Thereafter, through-openings are formed in the encapsulation layer 24 above the source contact element 21A, the gate contact element 21B and the carrier 22. Then an electrically conductive material like, for example, copper is filled into the through-openings which can be done by, for example, galvanic plating, electro-plating or electro-less plating. As a result, a transistor device 20 in the form of a laminate package is fabricated as shown in FIG. 2A. As a result, the transistor device 20 comprises an upper main face 20A on which all contact elements of the semiconductor die 21 are disposed. FIG. 2B shows a top view representation of the transistor device 20.

The semiconductor die 21 can be, for example, a silicon die and the vertical transistor structure can be, for example, an insulated gate bipolar transistor.

The transistor device 20 can be used to fabricated an electronic device similar to that shown in FIGS. 1A-1H. This can be done in different ways, one of which is illustrated in FIG. 2C. The electronic device 30, as shown in FIG. 2C, comprises an un-laminated transistor device 31 like one of the transistor devices 1 and 2 of FIGS. 1A-1H and the transistor device 20 of FIGS. 2A and 2B and connect them to fabricate an electronic device 30 in the same way as the electronic device 10 was fabricated according to FIGS. 1A-1H. The electronic device 30 of FIG. 2C similarly comprises an electrical connection element 33 comprising a plurality of lead elements as well as an encapsulation layer 34.

It is also possible to use two transistor devices 20 as shown in FIGS. 2A and 2B and connect them for fabricating an electronic device. The result is shown in FIGS. 3A and 3B in which FIG. 3A shows a top view representation and FIG. 3B shows a cross-sectional side view representation of an electronic device 30 along line A-A of FIG. 3A. The electronic device 30 comprises a first transistor device 31, a second transistor device 32, an electrical connection member 33, and an encapsulation layer 34. The first and second transistor devices 31 and 32 can be identical and can be formed in the same way as the transistor device 20 of FIGS. 2A and 2B. The electrical connection element 33 comprises lead elements 33.1 to 33.5, wherein lead element 33.1 connects the source contact element of the first transistor device 31 with the drain contact element of the second transistor device 32.

The electronic devices 10 of FIGS. 1A-1H, 20 of FIGS. 2A-2C, and 30 of FIGS. 3A and 3B can be used to fabricate a half-bridge circuit therefrom. For this purpose the electronic device can be mounted to a printed circuit board and can thus be connected to further electrical devices for completing the half-bridge circuit. For example, one or more of a capacitor, an inductor, and a resistor can be also connected to the printed circuit board to form a half-bridge circuit together with the electronic device. The capacitor may then be coupled to a node between the first and second transistor devices. Alternatively, these elements can also be integrated within the electronic device.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. An electronic device comprising:
    exactly two horizontal transistor devices, the exactly two horizontal transistor devices including a first horizontal transistor device and a second horizontal transistor device;
    the first horizontal transistor device comprising first contact elements arranged on a first active main face, the first contact elements comprising a first source contact element, a first drain contact element, and a first gate contact element, wherein the first gate contact element is disposed near a lateral side edge of the first active main face;
    the second horizontal transistor device comprising second contact elements arranged on a second active main face, the second contact elements comprising a second source contact element, a second drain contact element, and a second gate contact element, wherein the second gate contact element is disposed near a lateral side edge of the second active main face; and
    an electrical connection member consisting of exactly five lead elements, each one of the five lead elements comprising a first main face and a second main face opposite the first main face, the electrical connection member being interposed between the first horizontal transistor device and the second horizontal transistor device,
    wherein the first horizontal transistor device and the second horizontal transistor device are disposed relative to each other so that the first active main face and the second active main face are facing each other, and that the first horizontal transistor device and the second horizontal transistor device are laterally displaced from each other so that both of the first active main face and the second active main face have central regions respectively lying directly opposite to each other and both of the first active main face and the second active main face have laterally protruding regions respectively,
    wherein the first drain contact element is disposed in the central region of the first active main face and directly facing the second source contact element disposed in the central region of the second active main face,
    wherein the first gate contact element is disposed in the laterally protruding region of the first active main face and the second gate contact element is disposed in the laterally protruding region of the second active main face, wherein the first source contact element is disposed in the laterally protruding region of the first active main face and the second drain contact element is disposed in the laterally protruding region of the second active main face, wherein a first lead element of the five lead elements is directly connected between the first drain contact element and the second source contact element, the first drain contact element being attached to the first main face of the first lead element and the second source contact element being attached to the second main face of the first lead element, wherein a second lead element of the five lead elements is directly connected with the second drain contact element, wherein a third lead element of the five lead elements is directly connected with the second gate contact element, wherein a fourth lead element of the five lead elements is directly connected with the first source contact element, wherein a fifth lead element of the five lead elements is directly connected with the first gate contact element, wherein the five lead elements are arranged in a row and extend in parallel to each other in one direction and the third lead element is located at one laterally outermost end of the row of lead elements and the fifth lead element is located at the other laterally outermost end of the row of lead elements, and wherein an encapsulation layer forms a lamination package embedding the first horizontal transistor device, the second horizontal transistor device and respective parts of the five lead elements in such a way that respective end portions of the five lead elements protrude outside the lamination package.

2. The electronic device according to claim 1, wherein the first horizontal transistor device or the second horizontal transistor device comprises a power transistor, a metal-oxide-semiconductor (MOS) transistor, an insulated gate bipolar transistor, or a high electron mobility transistor.

3. The electronic device according to claim 1, wherein the first horizontal transistor device or the second horizontal transistor device comprises a III-V based semiconductor material.

4. The electronic device according to claim 3, wherein the III-V based semiconductor material comprises a GaN based semiconductor material.

5. The electronic device according to claim 1, wherein the first horizontal transistor device or the second horizontal transistor device comprises a Si based semiconductor material.

6. The electronic device according to claim 1, wherein the first horizontal transistor device comprises a III-V based semiconductor material and the second horizontal transistor device comprises a Si based semiconductor material.

7. The electronic device according to claim 1, wherein the first horizontal transistor device or the second horizontal transistor device comprises a semiconductor die.

8. The electronic device according to claim 1, wherein the first horizontal transistor device or the second horizontal transistor device comprises a semiconductor die embedded in a die encapsulation layer.

9. The electronic device according to claim 1, wherein the electrical connection member is a leadframe or a direct bonded copper.

10. The electronic device according to claim 1, wherein the electronic device conforms with a transistor outline (TO) package format.

\* \* \* \* \*